United States Patent
Yoshida et al.

(10) Patent No.: US 7,910,455 B2
(45) Date of Patent: Mar. 22, 2011

(54) METHOD FOR PRODUCING SOI WAFER

(75) Inventors: Kazuhiko Yoshida, Nagano (JP); Masao Matsumine, Nagano (JP); Hiroshi Takeno, Gunma (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 197 days.

(21) Appl. No.: 12/226,544

(22) PCT Filed: Apr. 16, 2007

(86) PCT No.: PCT/JP2007/058239
§ 371 (c)(1),
(2), (4) Date: Oct. 21, 2008

(87) PCT Pub. No.: WO2007/125771
PCT Pub. Date: Nov. 8, 2007

(65) Prior Publication Data
US 2009/0104752 A1 Apr. 23, 2009

(30) Foreign Application Priority Data
Apr. 27, 2006 (JP) .................. 2006-123960

(51) Int. Cl.
*H01L 21/46* (2006.01)
(52) U.S. Cl. . 438/455; 438/458; 438/459; 257/E21.567; 257/E21.568; 257/E21.569
(58) Field of Classification Search .......... 438/455, 438/456, 458, 459, 473; 257/E21.567–E21.57
See application file for complete search history.

(56) References Cited

U.S. PATENT DOCUMENTS

| | | | | |
|---|---|---|---|---|
| 5,229,305 A | * | 7/1993 | Baker | 438/459 |
| 5,374,564 A | | 12/1994 | Bruel | |
| 5,798,294 A | | 8/1998 | Okonogi | |
| 6,534,380 B1 | * | 3/2003 | Yamauchi et al. | 438/455 |

(Continued)

FOREIGN PATENT DOCUMENTS

JP A-4-293241 10/1992

(Continued)

OTHER PUBLICATIONS

Aug. 26, 2010 European Search Report issued in EP 07 74 1675.

*Primary Examiner* — Hsien-ming Lee
*Assistant Examiner* — Kevin Parendo
(74) *Attorney, Agent, or Firm* — Oliff & Berridge, PLC

(57) ABSTRACT

The present invention relates to a method for producing an SOI wafer, having at least a step of a bonding heat treatment for increasing bonding strength by heat-treating a bonded wafer obtained by bonding a base wafer and a bond wafer, in which argon is ion-implanted from a surface of either the base wafer or the bond wafer at a dosage of $1\times10^{15}$ atoms/cm$^2$ or more at least before the bonding step, the surface ion-implanted with argon is used as a bonding surface in the bonding step, and an increase rate of temperature to a treatment temperature of the bonding heat treatment is 5° C./minute or higher. Thus the present invention provides a method for producing an SOI wafer facilitating the efficient production of an SOI wafer having in the neighborhood of a buried insulator layer thereof a polycrystalline silicon layer uniform in thickness introduced and having high gettering ability toward metal contaminations in the SOI layer by a simple and low-cost method.

21 Claims, 10 Drawing Sheets

U.S. PATENT DOCUMENTS

| | | | |
|---|---|---|---|
| RE39,484 E | 2/2007 | Bruel | |
| 7,276,427 B2 * | 10/2007 | Ichikawa et al. | 438/455 |
| 2002/0187619 A1 | 12/2002 | Kleinhenz et al. | |
| 2005/0101104 A1 | 5/2005 | Schwarzenbach et al. | |
| 2005/0245048 A1 * | 11/2005 | Graf et al. | 438/455 |
| 2006/0055003 A1 * | 3/2006 | Tomita et al. | 257/629 |
| 2006/0063353 A1 * | 3/2006 | Akatsu | 438/455 |

FOREIGN PATENT DOCUMENTS

| | | |
|---|---|---|
| JP | A-04-293251 | 10/1992 |
| JP | A-06-163862 | 6/1994 |
| JP | A-06-275525 | 9/1994 |
| JP | B2-3048201 | 3/2000 |
| WO | WO 2004/008514 A1 | 1/2004 |

* cited by examiner

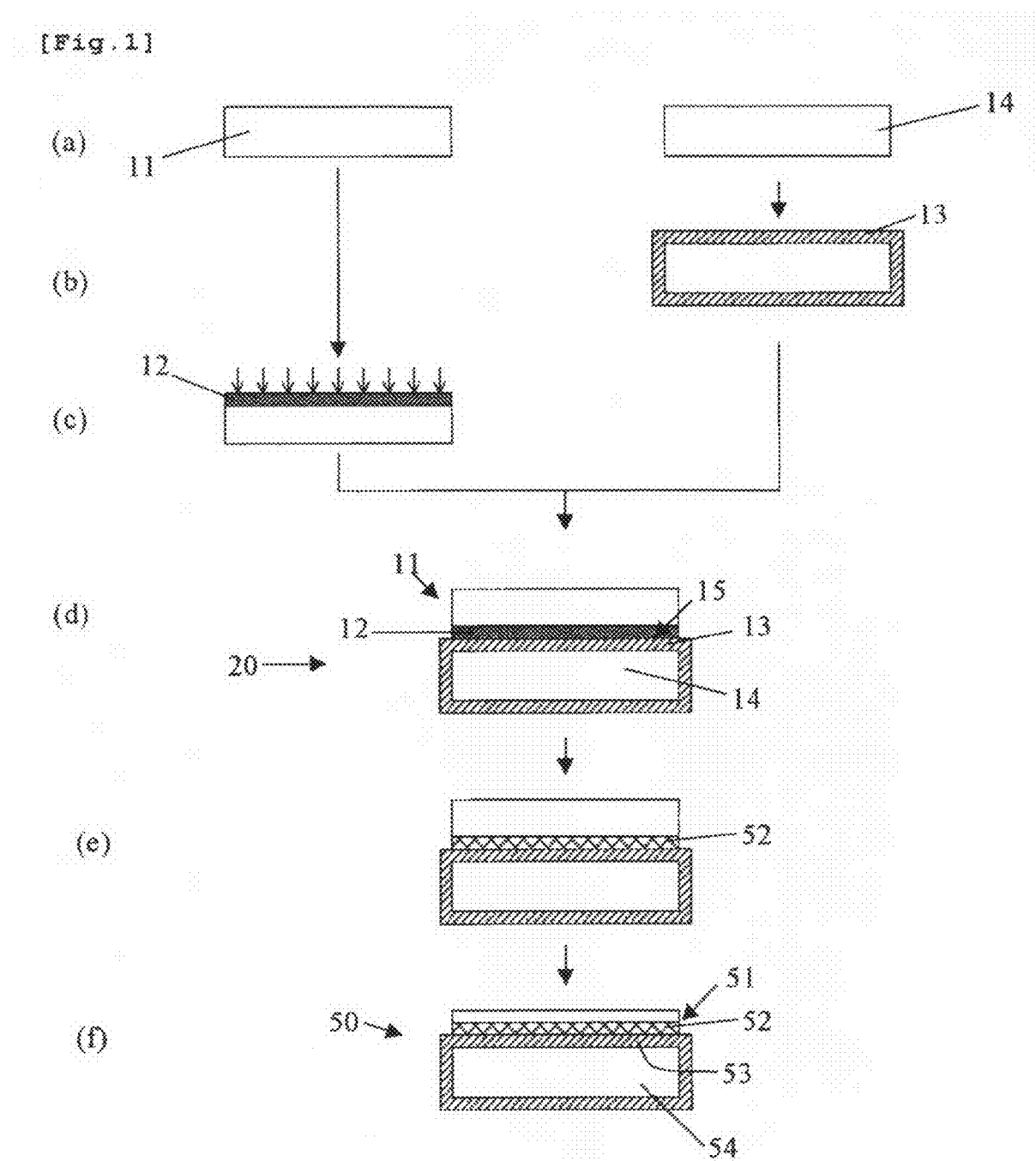

[Fig.2]
(a)
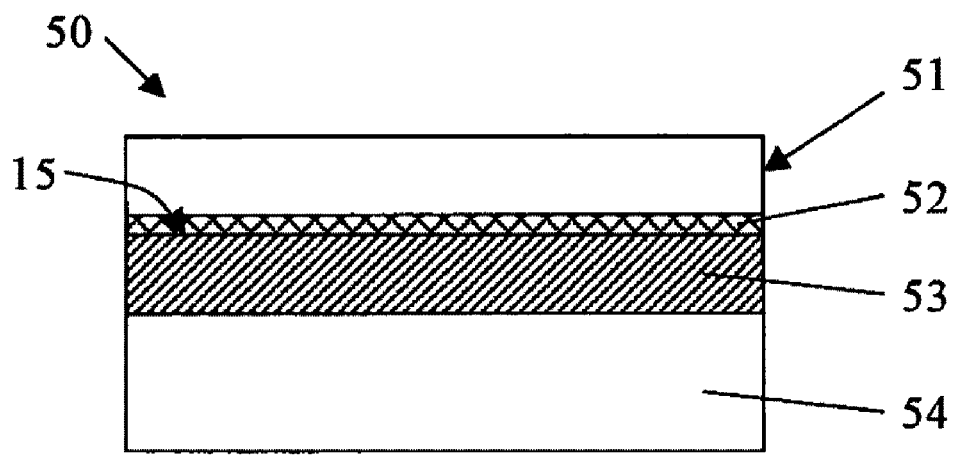
(b)
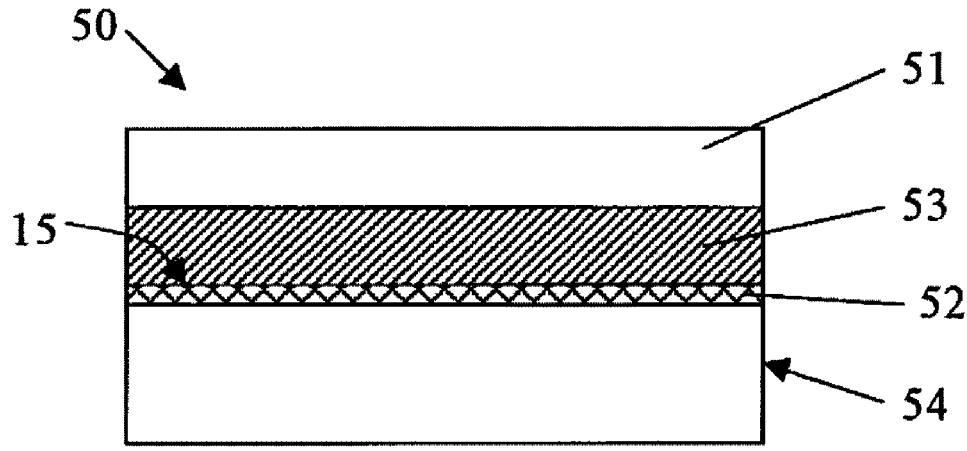

[Fig.3]
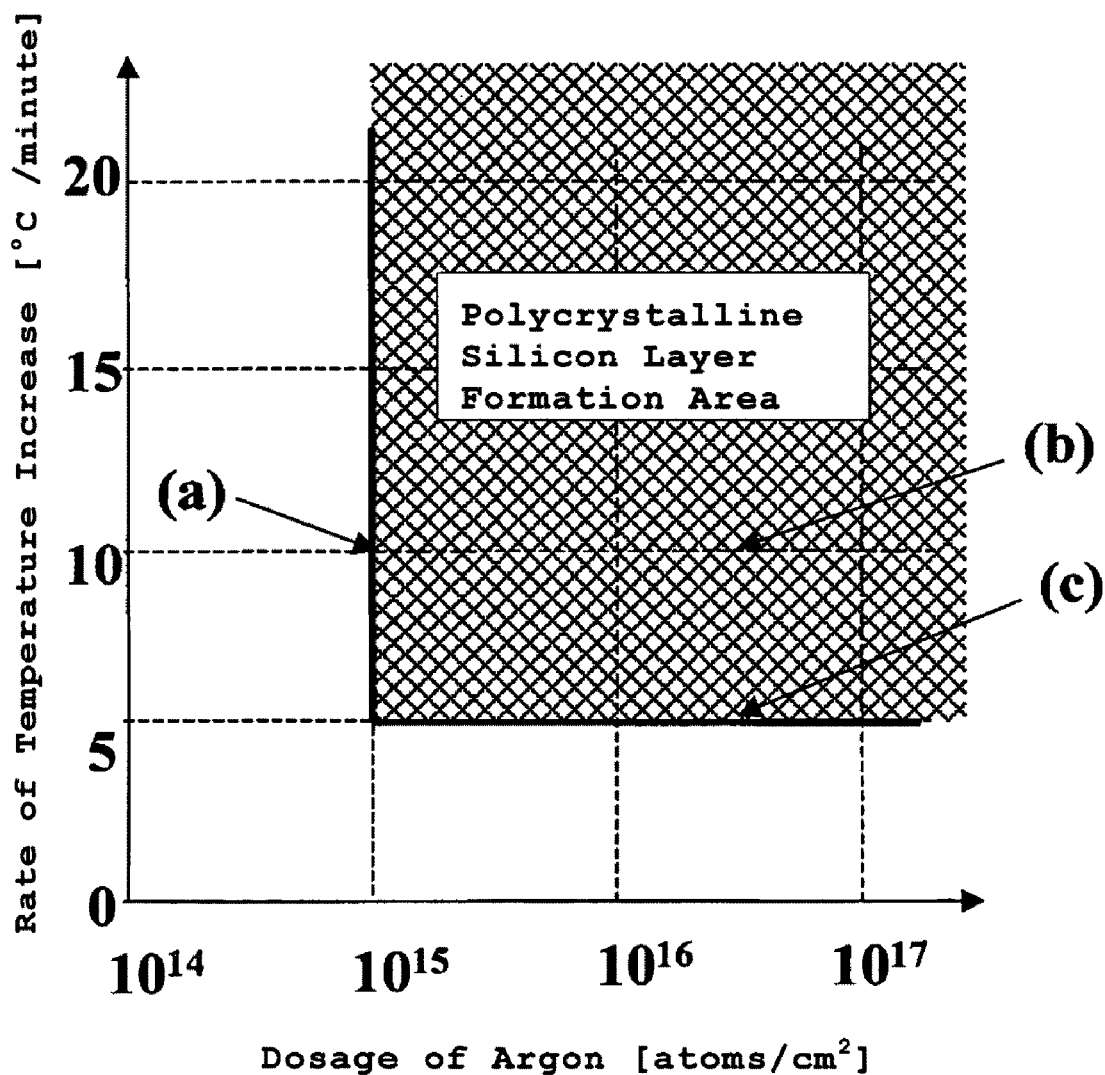

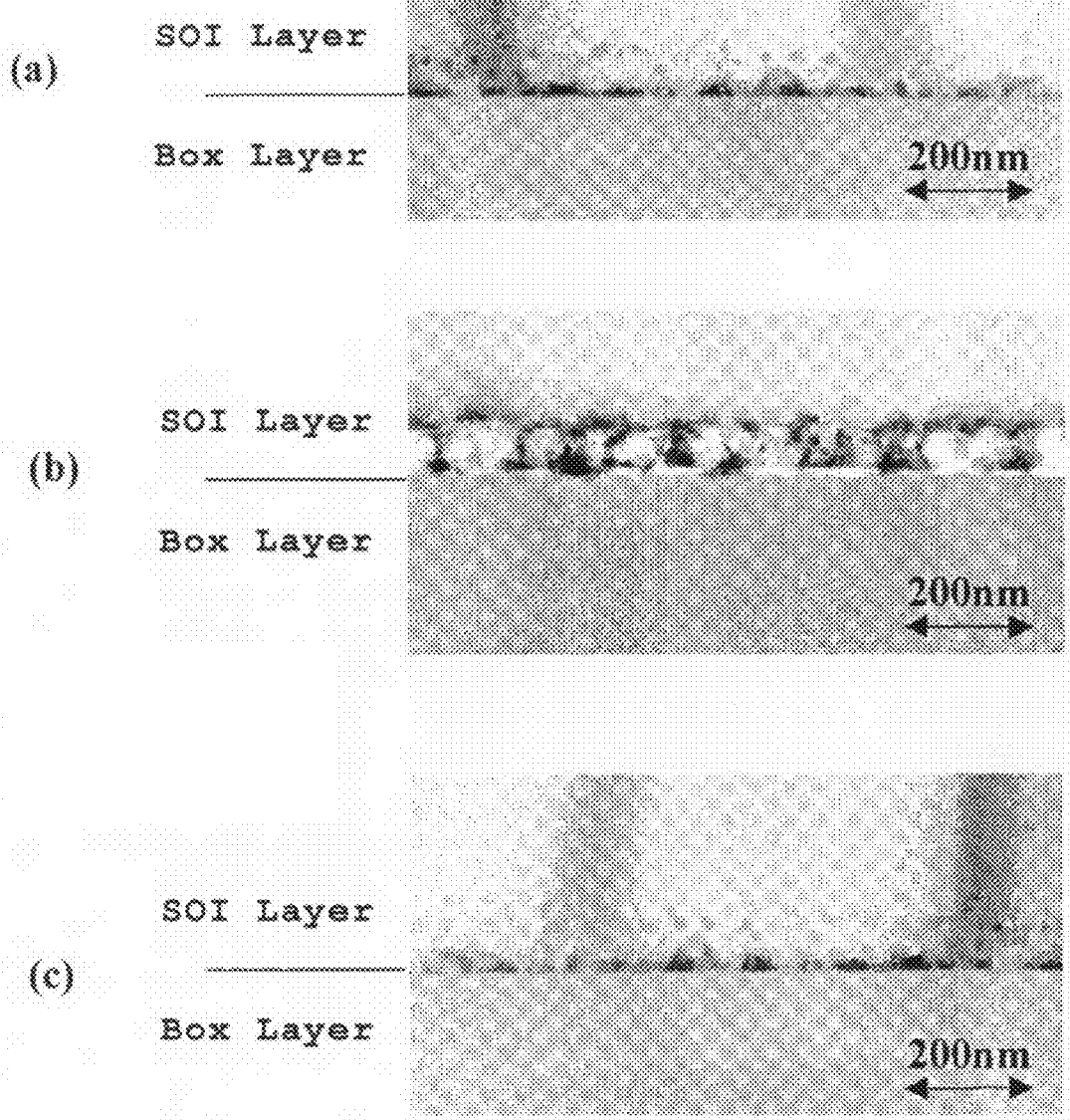
[Fig.4]

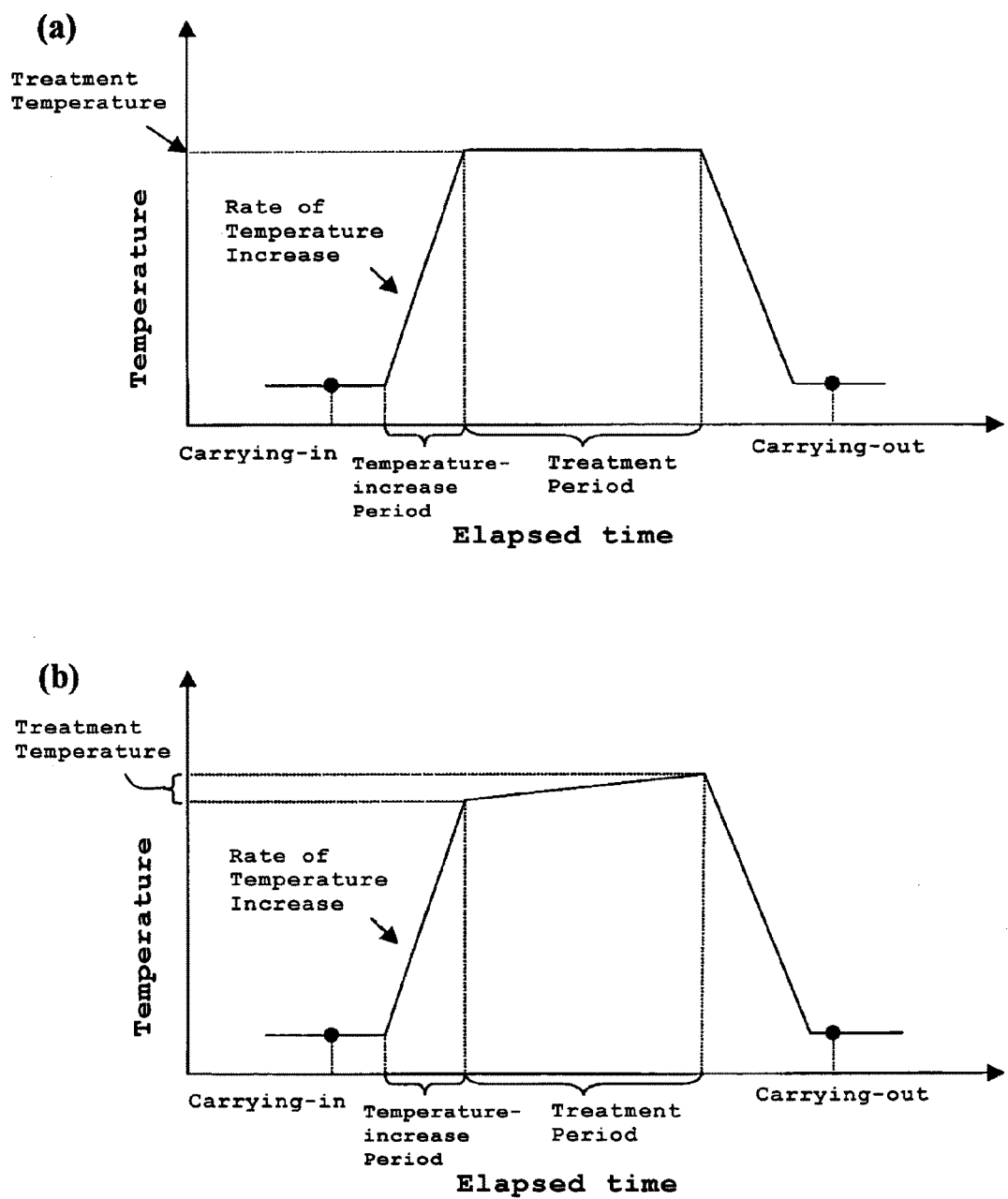
[Fig.5]

[Fig. 6]
(a)
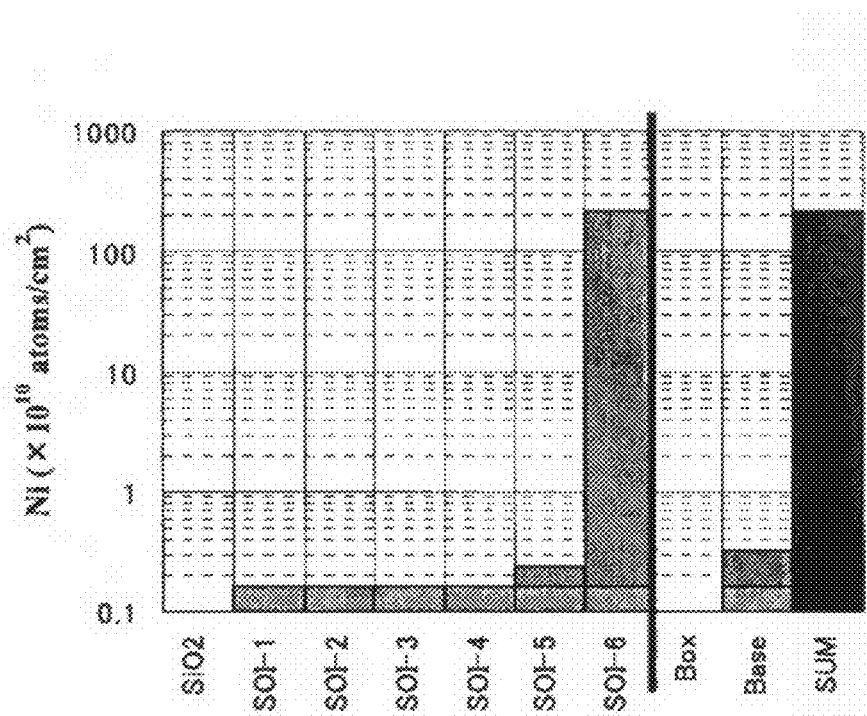
(b)
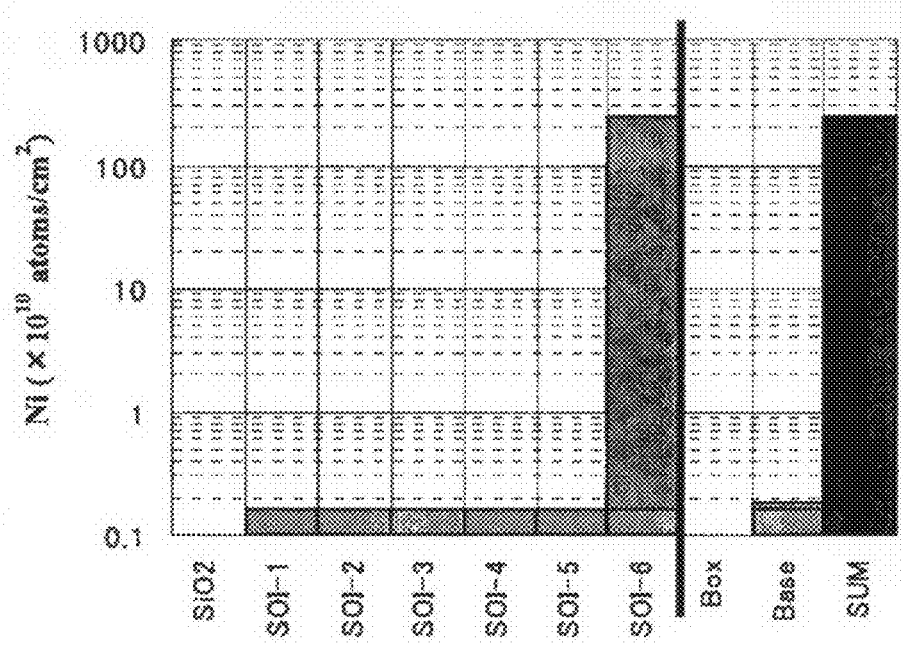

[Fig. 7]
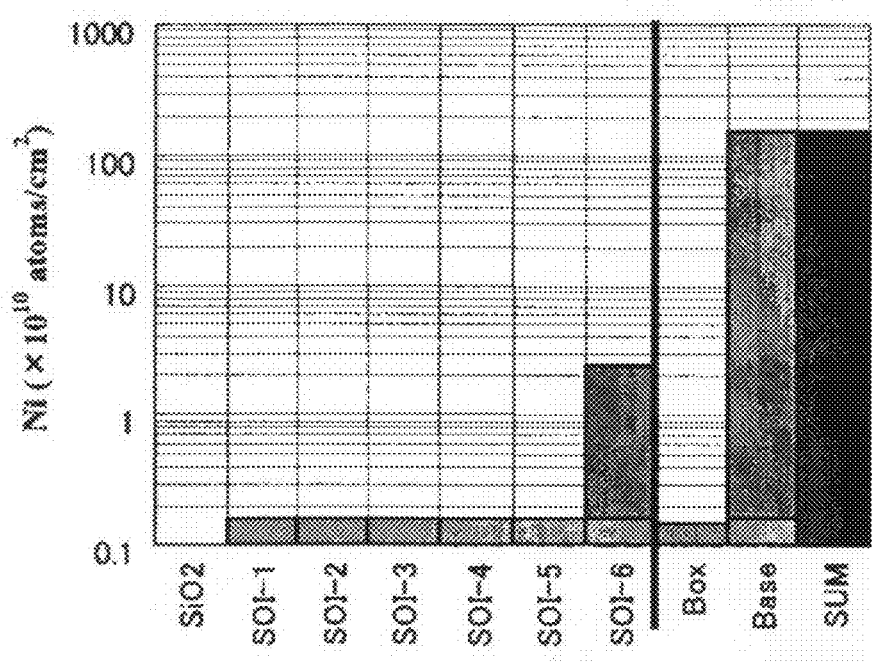
[Fig. 8]
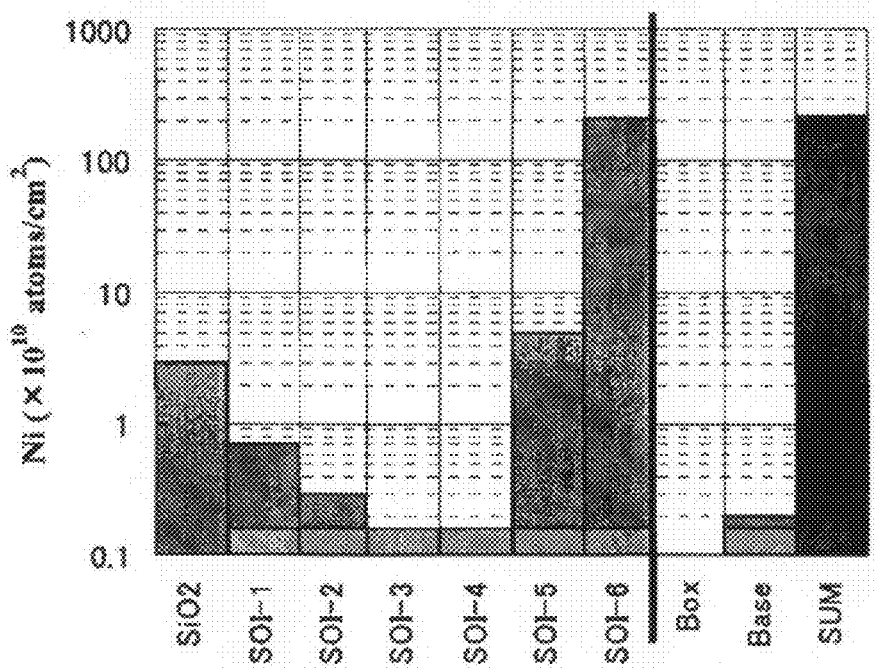

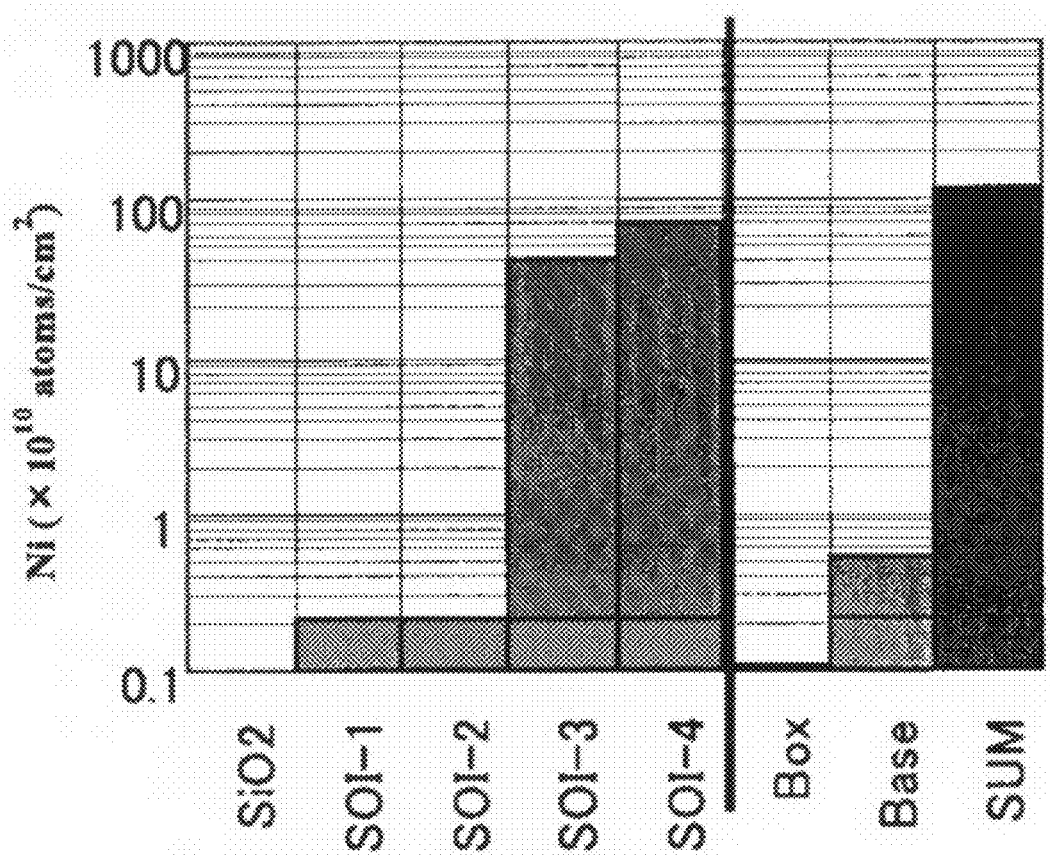
[Fig. 9]

[Fig.10]
(a)
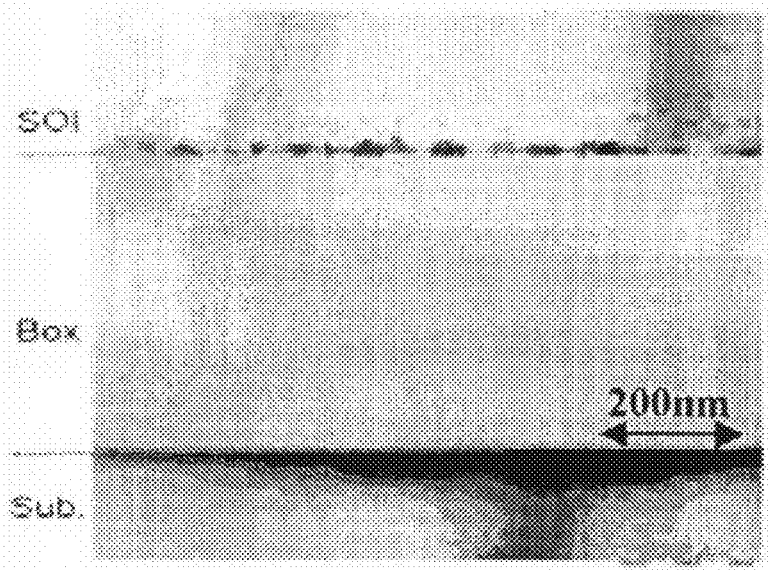
(b)
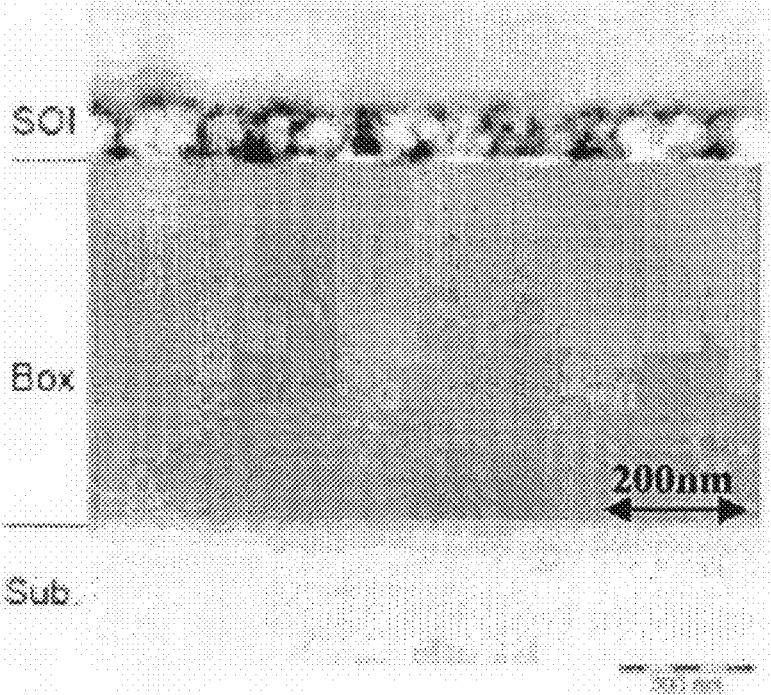

[Fig.11]
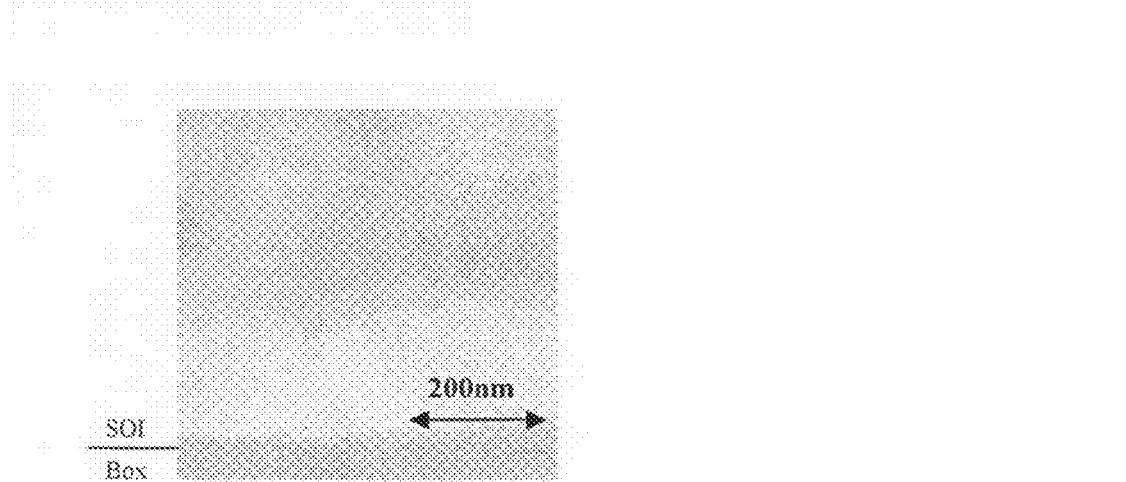
[Fig.12]
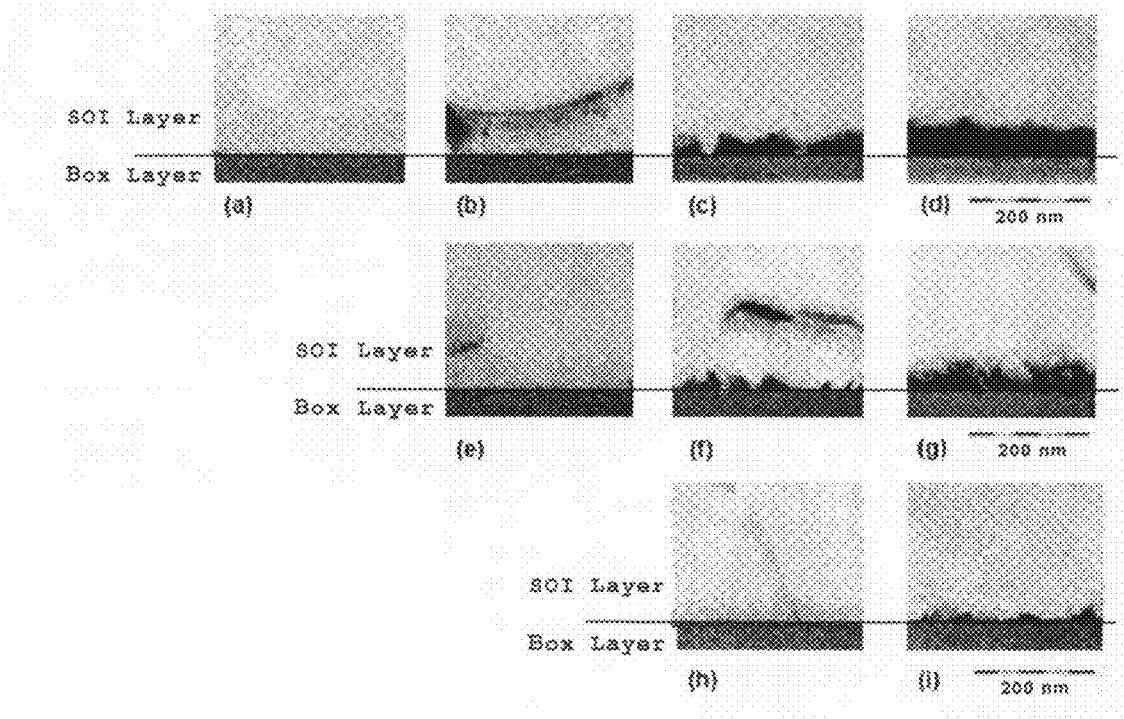

METHOD FOR PRODUCING SOI WAFER

TECHNICAL FIELD

The present invention relates to a method for producing an SOI (Silicon on Insulator) wafer by a bonding method and particularly to a method for producing an SOI wafer added with gettering ability by introducing a polycrystalline silicon layer in the neighborhood of a buried insulator layer.

BACKGROUND ART

SOI wafers have recently been used to produce highly integrated CMOSs, ICs, high breakdown voltage devices and the like. A concrete structure of an SOI wafer is comprised of a three-layer structure in the depth direction of the wafer as follows: a silicon single crystal layer (hereinafter referred to as an SOI layer) that is a surface layer and is used as an active layer providing an area for fabricating a device; a buried insulator layer (hereinafter sometimes referred to as a Box layer in the case of a silicon oxide film) such as an oxide film put under the silicon single crystal layer; and another silicon single crystal layer (hereinafter referred to as a support substrate) is placed under the buried insulator layer. The SOI wafer with such a structure has characteristics such as a low parasitic capacitance and a high radiation resistance. Therefore effects such as high-speed, low power-consumption performance, latch up suppression are expected and the SOI wafer is promising as a substrate for a high-performance semiconductor device.

As a method for producing the SOI wafer, for example, the following bonding methods are known. Namely, two mirror-polished silicon single crystal wafers (a silicon single crystal wafer to serve as an SOI layer (a bond wafer) and a silicon single crystal wafer to serve as a support substrate (a base wafer)) are prepared and an oxide film is formed on a surface of at least one of the silicon single crystal wafers. Next, after the silicon single crystal wafers are bonded via the oxide film, a bonding heat treatment is conducted in order to increase bonding strength. Then, the bond wafer is thinned to obtain an SOI wafer having an SOI layer formed. Examples of methods for thinning are as follows: a method where grinding, polishing, or the like are performed on the bond wafer until a desired thickness is obtained; and a method, which is called an ion implantation delamination method (for example, Japanese Patent No. 3048201), where a delamination layer is formed by ion-implanting hydrogen or helium in advance before bonding, thinning is conducted by a delamination heat treatment at a temperature lower than the temperature of the bonding heat treatment and a delamination of the bond wafer at the delamination layer, and then the above-mentioned bonding heat treatment is conducted.

Although the SOI wafer has a lot of structural advantages in view of electrical characteristics as described above, the SOI wafer has structural disadvantages in view of resistance to contamination with metal impurities. This is because diffusion rates of metal impurities are generally slower in silicon oxide than in silicon. Thereby, in the case of a contamination from an SOI layer surface, the metal impurities accumulate in the thin SOI layer due to the difficulty for the metal impurities to pass the Box layer. Thus a harmful effect of metal contamination is increased as compared with a silicon substrate having no SOI structures. Therefore it is one of the more important qualities in the case of an SOI wafer to have the ability of capturing metal impurities and removing the metal impurities from the area to serve as an active layer for a semiconductor device (gettering ability).

In each gettering method generally used for a silicon substrate having no SOI structures (oxide precipitation, high-density boron addition, a back surface polycrystalline silicon film, and the like), a gettering layer is introduced on the support substrate opposite to the active layer. However, even if a gettering layer is introduced on the support substrate according to the similar techniques, the above-mentioned gettering layer does not function fully due to the difficulty for the metal impurities to pass the Box layer, thus there is a problem in that these techniques are not to be applied to an SOI wafer as they are.

In order to address such a problem, in methods for producing an SOI wafer by a bonding method, there have conventionally been proposed methods where a gettering area is introduced in the neighborhood of the SOI layer.

For example, there is proposed a method where a polycrystalline silicon film is formed on a surface of the bond wafer before bonding using a CVD method (chemical vapor deposition method) and a polycrystalline silicon layer is introduced in an interface area of the SOI layer with the Box layer by bonding the bond wafer and the base wafer via an oxide film using a surface having the polycrystalline silicon film formed thereon as a bonding surface to produce an SOI wafer in which the polycrystalline silicon layer has an extrinsic gettering effect for the SOI layer (see, e.g., Japanese Patent Application Laid-Open Publication No. H6-275525).

However, in a method in which a polycrystalline silicon layer is introduced in the neighborhood of the Box layer by a CVD method mentioned above, due to the inconstancy of a film thickness of the polycrystalline silicon layer produced by a CVD method, a complicated process, as is represented by mirror polishing required before bonding, has been required. Such being the case, there has been a problem in that the cost is increased and productivity is lowered. There has also been a problem in that variation in crystalline interface influences the mirror polishing process to widen variation of a thickness of the polycrystalline silicon layer, leading to variation in a thickness of the SOI layer.

DISCLOSURE OF THE INVENTION

Thus the present invention has been completed in view of such problems and an object of the present invention is to provide a method for efficiently producing an SOI wafer having a polycrystalline silicon layer uniform in thickness introduced in the neighborhood of a buried insulator layer and having high gettering ability for metal impurities in the SOI layer by a convenient and cost-effective method.

The present invention has been completed in order to address the above-mentioned problems and provides a method for producing an SOI wafer having at least the steps of: preparing a base wafer and a bond wafer each made of silicon single crystal; forming an insulator film on a surface of at least one of the base wafer and the bond wafer; bonding the base wafer and the bond wafer via the insulator film; a bonding heat treatment for increasing bonding strength by heat-treating the bonded wafer obtained by bonding the base wafer and the bond wafer; and thinning the bond wafer bonded, in which argon is ion-implanted from a surface of either the base wafer or the bond wafer at a dosage of $1 \times 10^{15}$ atoms/cm$^2$ or more at least before the bonding step, the surface ion-implanted with argon is used as a bonding surface in the bonding step, and an increase rate of temperature to a treatment temperature of the bonding heat treatment is 5° C./minute or higher.

In a method for producing an SOI wafer having such steps, when the step of ion-implanting argon, at least before the bonding step, from the surface of either the base wafer or the bond wafer at the dosage of $1\times10^{15}$ atoms/cm$^2$ or more is included, the surface ion-implanted with argon is used as a bonding surface in the bonding step, and the increase rate of temperature to the treatment temperature of the bonding heat treatment is 5° C./minute or higher, a polycrystalline silicon layer having a flat surface and a high degree of uniformity in film thickness is formed immediately under or directly on a buried insulator layer and an SOI wafer added with excellent gettering ability is efficiently produced in simple steps at a low cost. Moreover, because a film thickness of a polycrystalline silicon layer is controlled by the acceleration voltage of ion-implanting, the controllability of the film thickness of the polycrystalline silicon layer is high.

On this occasion, the bonding heat treatment is preferably maintaining a temperature of 1100° C. or more for two hours or more.

When the bonding heat treatment is maintaining the temperature of 1100° C. or more for two hours or more as mentioned above, a polycrystalline silicon layer can be formed more definitely.

Furthermore, in the thinning of the bond wafer, the film thickness of the bond wafer may be 1 µm or more and 50 µm or less.

When the film thickness of the bond wafer is 1 µm or more in the thinning of the bond wafer as mentioned above, an area large enough to produce a device can be secured even in the case of forming a polycrystalline silicon layer on the bond wafer. On the other hand, when the film thickness is 50 µm or less, there is obtained an SOI wafer practical enough for fabricating various devices.

The insulator film is preferably a silicon oxide film, a silicon nitride film, or a combination of these.

When the insulator film is a silicon oxide film, a silicon nitride film, or a combination of these as mentioned above, a fine, high-quality insulator film is easily formed and an SOI wafer excellent in both an insulating property and gettering ability can be produced.

Furthermore, the thinning of the bond wafer may be carried out by grinding the bond wafer. The thinning of the bond wafer may also be carried out by preparing an ion-implanted layer for delaminating before the step of bonding in advance through ion-implanting hydrogen or helium from a surface of the bond wafer and delaminating the bond wafer at the ion-implanted layer for delaminating through a delaminating heat treatment in the step of thinning the bond wafer.

As mentioned above, when thinning of the bond wafer is carried out by grinding the bond wafer, which is appropriate for forming a thick SOI layer, or by an ion implantation delamination method, which is appropriate for forming a thin SOI layer, sufficient gettering ability can be added by introducing a polycrystalline silicon layer.

There may also be introduced a step of forming an n$^+$ layer by ion-implanting the element to serve as a donor in silicon from the surface to be ion-implanted with argon at least before the step of bonding. In this case, the element to serve as a donor may be at least any one of phosphorus, arsenic, and antimony.

When the step of forming an n$^+$ layer by ion-implanting the element to serve as a donor in silicon from the surface to be ion-implanted with the neutral element at least before the step of bonding is introduced and the element serve as a donor is at least any one of phosphorus, arsenic, and antimony as mentioned above, a stronger gettering site is formed combining gettering ability by the n$^+$ layer with gettering ability added by a polycrystalline silicon layer.

According to the present invention, there can efficiently be produced an SOI wafer in which a polycrystalline silicon layer having a flat interface and a high degree of uniformity in film thickness is formed in simple steps. An SOI wafer having such a polycrystalline silicon layer formed thereon is also more effective for the gettering of metal impurities in the SOI layer.

BRIEF DESCRIPTION OF THE DRAWINGS

FIG. 1 shows an outline of a method for producing an SOI wafer according to a bonding method of the present invention;

FIG. 2 show sectional views of SOI wafers related to the present invention, (a) shows a case where a polycrystalline silicon layer is formed on the bond wafer, and (b) shows a case where a polycrystalline silicon layer is formed on the base wafer;

FIG. 3 shows the relationship between a dosage at the time of ion-implanting argon and an increase rate of temperature during the bonding heat treatment;

FIG. 4 show sectional TEM images around ion-implanted layers of SOI wafers and shown are the cases where a dosage of argon and an increase rate of temperature in this order are (a) $1\times10^{15}$ atoms/cm$^2$, 10° C./min, (b) $4\times10^{16}$ atoms/cm$^2$, 10° C./min, and (c) $4\times10^{16}$ atoms/cm$^2$, 5° C./min;

FIG. 5 are for explaining temperature profiles related to the present invention;

FIG. 6 are graphs showing examples of gettering abilities of SOI wafers of the present invention, (a) shows a case where a dosage of argon is $1\times10^{15}$ atoms/cm$^2$, and (b) shows a case where a dosage of argon is $4\times10^{16}$ atoms/cm$^2$;

FIG. 7 is a graph showing an example of gettering ability in a case where a base wafer of an SOI wafer of the present invention is ion-implanted;

FIG. 8 is a graph showing an example of gettering ability of an SOI wafer in a case where a dosage of argon is $1\times10^{14}$ atoms/cm$^2$;

FIG. 9 is a graph showing an example of gettering ability of an SOI wafer when a polycrystalline silicon layer is introduced by a conventional CVD method;

FIG. 10 show sectional TEM images of SOI wafers of the present invention, (a) shows a case where a dosage of argon is $1\times10^{15}$ atoms/cm$^2$ and (b) shows a case where a dosage of argon is $4\times10^{16}$ atoms/cm$^2$;

FIG. 11 shows a sectional TEM image of an SOI wafer in a case where a dosage of argon is $1\times10^{14}$ atoms/cm$^2$; and FIG. 12 show sectional TEM images of SOI wafers of the present invention, (a) shows a case where a dosage of argon is $1\times10^{14}$ atoms/cm$^2$ and an increase rate of temperature is 10° C./minute (Comparative Example 3), (b) shows a case where a dosage of argon is $5\times10^{14}$ atoms/cm$^2$ and an increase rate of temperature is 10° C./minute (Comparative Example 4), (c) shows a case where a dosage of argon is $1\times10^{15}$ atoms/cm$^2$ and an increase rate of temperature is 10° C./minute (Example 4), (d) shows a case where a dosage of argon is $1\times10^{16}$ atoms/cm$^2$ and an increase rate of temperature is 10° C./minute (Example 5), (e) shows a case where a dosage of argon is $5\times10^{14}$ atoms/cm$^2$ and an increase rate of temperature is 5° C./minute (Comparative Example 5), (f) shows a case where a dosage of argon is $1\times10^{15}$ atoms/cm$^2$ and an increase rate of temperature is 5° C./minute (Example 6), (g) shows a case where a dosage of argon is $1\times10^{16}$ atoms/cm$^2$ and an increase rate of temperature is 5° C./minute (Example 7), (h) shows a case where a dosage of argon is $1\times10^{15}$ atoms/cm$^2$ and an increase rate of temperature is 1° C./minute (Comparative Example 6), and (i) shows a case where a dosage of argon is $1\times10^{16}$ atoms/cm$^2$ and an increase rate of temperature is 1° C./minute (Comparative Example 7).

BEST MODE(S) FOR CARRYING OUT THE INVENTION

Hereinafter, the present invention will be specifically described.

As described before, there has been awaited the development of a method for producing an SOI wafer that makes it possible to effectively produce an SOI wafer having a polycrystalline silicon layer placed in the neighborhood of a buried insulator layer and being added with excellent gettering ability for metal contaminations in an SOI layer with high productivity and at a low cost.

Such being the case, the present inventors continued intensive investigations on the possibilities of giving an SOI wafer sufficient gettering ability by introducing a polycrystalline silicon layer in the neighborhood of a buried insulator layer without using a CVD method, which necessitates polishing after depositing a polycrystalline silicon film.

As a result, the present inventors have found that, in a method for producing an SOI wafer by a bonding method, by ion-implanting a silicon single crystal wafer with argon at a dosage of a predetermined value or more before bonding, bonding the surface ion-implanted with argon as a bonding surface followed by keeping an increase rate of temperature to a treatment temperature at a predetermined value or higher, the layer ion-implanted with argon grows to be a polycrystal and becomes a polycrystalline silicon layer.

As to the dosage of argon and the increase rate of temperature mentioned above, the present inventors have conducted experiments under the following conditions to find that, by ion-implanting argon and performing a heat-increasing step of a bonding heat treatment after bonding under the conditions in the area approximately corresponding to the shaded part in FIG. 3, an ion-implanted damaged layer having argon ion-implanted can be turned into a polycrystalline silicon layer.

FIGS. 4 (*a*), (*b*), and (*c*) show sectional TEM images in cases where a dosage of argon and an increase rate of temperature before a bonding heat treatment are $1\times10^{15}$ atoms/cm$^2$, 10° C./minute (point (a) in FIG. 3); $4\times10^{16}$ atoms/cm$^2$, 10° C./minute (point (b) in FIG. 3); $4\times10^{16}$ atoms/cm$^2$, and 5° C./minute (point (c) in FIG. 3); respectively. It was observed that a polycrystalline silicon layer was beginning to be formed under the conditions of points (a) and (c) in FIG. 3 and that a polycrystalline silicon layer was more definitely formed under the conditions of point (b) in FIG. 3. Furthermore, no crystalline grain boundaries were observed under the conditions of an argon dosage of $1\times10^{14}$ atoms/cm$^2$ and an increase rate of temperature before a bonding heat treatment of 10° C./min. These experimental results reveal that a polycrystalline silicon layer is formed when a dosage of argon is in the range of $1\times10^{15}$ atoms/cm$^2$ or more and an increase rate of temperature before a bonding heat treatment is 5° C./minute or more.

Namely, the present inventors have found that a dosage of argon at the time of ion-implanting and an increase rate of temperature to a treatment temperature are closely related to the formation of a polycrystalline silicon layer and have completed the present invention.

The present invention will now be explained hereinafter in detail with reference to the drawings, but the present invention is not restricted thereto.

FIG. 1 shows an example of a method for producing an SOI wafer by a bonding method of the present invention. An outline of a method for producing an SOI wafer by a bonding method to which the present invention is applied is shown below.

First, in Step (a), a silicon single crystal wafer (bond wafer) 11 to serve as an SOI layer for forming a semiconductor device and a silicon single crystal wafer (base wafer) 14 to serve as a support substrate are prepared.

Next, in Step (b), an insulator film 13 to serve as a buried insulator layer is formed on at least one of the base wafer 14 and the bond wafer 11 (Shown in FIG. 1 is the insulator film 13 formed on the base wafer 14.). It should be noted that the insulator film 13 is exemplified by a silicon oxide film, a silicon nitride film and the like. A silicon oxide film is preferable because a fine and high-quality product is produced by thermal oxidation of the bond wafer or the base wafer but the present invention is not limited to this method. Furthermore, when forming a silicon nitride film, a silicon oxynitride film, or another insulator film, general methods may be used for forming them. In addition, a silicon nitride film may be combined with a silicon oxide film.

Next, in Step (c), from a surface of at least one of the base wafer 14 and the bond wafer 11, argon is ion-implanted at a dosage of $1\times10^{15}$ atoms/cm$^2$ or more to form an ion-implanted damaged layer 12 (Shown in FIG. 1 is a case where an ion-implanted damaged layer is formed on the bond wafer 11). On this occasion, even when the wafer having the insulator film formed in Step (b) is ion-implanted with argon, an ion-implanted damaged layer is formed under the insulator film without any problem. Furthermore, at the time of ion-implanting the wafer where an insulator film was not formed in Step (b), a screen oxide film (an oxide film for surface protection) may be formed prior to ion-implanting on a surface to be ion-implanted. The removal of the screen oxide film before a bonding step of Step (d) described below is optional.

It should be noted that the order of Step (b) and Step (c) is optional.

The portion approximately corresponding to the ion-implanted damaged layer formed by ion-implanting in this step is turned into a polycrystal concurrently with the increase of the bond strength by a bonding heat treatment described below to produce a polycrystalline silicon layer. Namely, the thickness of a polycrystalline silicon layer is controllable by adjusting the acceleration voltage at the time of ion-implanting. In short, the present invention also has the advantage of being capable of controlling the thickness of a polycrystalline silicon layer easily by a simple method, that is, adjusting the acceleration voltage at the time of ion-implanting.

It should be noted that there is a difference in the place where a polycrystalline silicon layer is formed between the case of ion-implanting into the bond wafer 14 and the case of ion-implanting into the base wafer 11 and the differences of resultant effects will be described later.

Furthermore, a dosage of argon in the ion-implanting step is preferably, for example, $1\times10^{17}$ atoms/cm$^2$ or less. This is because a higher dosage than this increases the time for ion-implanting (For example, it takes two hours or more when the beam current is approximately 5 mA.), reduces productivity, and increases the cost.

Next, in Step (d), the base wafer 14 and the bond wafer 11 are, with the surface having ion-implanted damaged layer 12 formed thereon as a bonding surface, brought into close contact and bonded together via the insulator film 13. In this way, a bonded wafer 20 having a bonding surface 15 is obtained.

Next, in Step (e), a bonding heat treatment for increasing the bond strength of the bonding surface 15 is performed. The bonded wafer 20 is carried in a heat treatment apparatus and after the temperature is increased, the bonding heat treatment is performed. Incidentally, the temperature of the heat treatment apparatus when the bonded wafer 20 is carried in may be set at 800° C., for example, but is not limited thereto. In this bonding heat treatment, the two wafers are strongly bonded by performing a heat treatment, for example, under an oxidizing or inert atmosphere. On this occasion, an increase rate of temperature to a treatment temperature is set at 5° C./minute or higher. By setting an increase rate of temperature to a treatment temperature at 5° C./minute or higher, a polycrystalline silicon layer 52 may be formed corresponding to the ion-implanted damaged layer ion-implanted with argon. However, the whole of the ion-implanted damaged layer does not necessarily become a polycrystalline silicon layer.

In addition, a slip tend to generate in the neighborhood of the bonding surface 15 when the increase rate of temperature is higher than 20° C./min, therefore the increase rate of temperature is desirably 20° C./minute or lower.

Here "treatment temperature" denotes, as shown in FIG. 5, not only the temperature range when the temperature is kept constant after a heat-increasing process (FIG. 5 (a)) but also the temperature range when the temperature is kept at a certain value or higher and variation of temperature with time is gradual compared with the heat-increasing process (e.g. FIG. 5 (b)). Namely, in the present invention, an increase rate of temperature of 5° C./minute or higher is adequate to increase temperature to a bonding heat treatment temperature as high as or higher than a predetermined temperature.

Furthermore, in the bonding heat treatment, it is preferable to maintain a temperature of 1100° C. or more for two hours or more. Under such a condition of the bonding heat treatment, a polycrystalline silicon layer can be formed more definitely. It should be noted that, here "maintain" is not limited to keeping a certain temperature but also includes increasing or decreasing a temperature within a range of the treatment temperatures (as high as or higher than a predetermined temperature) or a combination thereof. For example, "maintaining a temperature of 1100° C. or more for two hours or more" mentioned above includes gradually increasing a temperature from 1100° C. to 1200° C. spending two hours as shown in FIG. 5 (b). Furthermore, the upper limit of the treatment temperature is naturally required to be as high as or lower than the melting point of silicon.

In order to produce an SOI wafer with high productivity, treatment time for a bonding heat treatment is preferably 6 hours or less for example, and far preferably, 4 hours or less.

After the bonding heat treatment is finished and the temperature is decreased to a predetermined value, the bonded wafer 20 is carried out of the heat treatment apparatus. Incidentally, the temperature of the heat treatment apparatus when the bonded wafer 20 is carried out may be set at 800° C., for example, but is not limited thereto.

Next, in Step (f), the bond wafer 11 is thinned to a target thickness to obtain an SOI wafer 50 having the polycrystalline silicon layer 52 and having an SOI layer 51 formed above a support substrate 54 via a buried insulator layer 53.

It should be noted that the bond wafer may be thinned, for example, by a method using surface grinding or mirror polishing or a method using etching, which is appropriate for forming a relatively thick SOI layer or by a method called "ion implantation delamination method", in which thinning is performed by preparing an ion-implanted layer for delaminating before Step (d) of bonding the bond wafer and the base wafer in advance through ion-implanting hydrogen or helium from the bonding surface of the bond wafer, followed by delaminating the bond wafer at the ion-implanted layer for delaminating, which is appropriate for forming a thin SOI layer. Incidentally, in the case of performing thinning by an ion implantation delamination method, the steps are in the following order: bonding at room temperature; delamination using heat treatment at a temperature approximately as low as 500° C., if necessary; and bonding heat treatment step (e) for increasing bonding strength. In addition, on this occasion, by bonding the wafer surface activated by plasma treatment, without performing the heat treatment at approximately 500° C. mentioned above, there may be used a method where delamination is performed by mechanical stress at the ion-implanted layer for delaminating.

Incidentally, the ion-implanted layer for delaminating may be formed before or after an ion-implanting step of argon for forming a polycrystalline silicon layer.

Furthermore, as to the film thickness of the bond wafer after thinning, an appropriate thickness may be chosen depending on a device to be fabricated on the SOI layer later and although there are no limitations in particular, the following is given as an example.

First, in a case where the bond wafer 11 is ion-implanted with argon and an ion-implanted damaged layer is formed on the SOI layer in Step (c), a thickness of the bond wafer 11 is preferably 1 μm or more in the step of thinning. This is for securing an area large enough to produce a device considering the fact that the depth to which argon is ion-implanted using a general ion-implanting apparatus is approximately 0.5 μm at an acceleration voltage of, for example, 200 keV.

Furthermore, when the film thickness of the bond wafer is 50 μm or less, the SOI wafer, when used as a substrate for fabricating a device, offers a full advantage of having an active area on the insulator film thereof.

The SOI wafer produced after such steps as mentioned above is structured to have a polycrystalline silicon layer at least immediately under or directly on the buried insulator layer. This polycrystalline silicon layer adds gettering ability to an interface area of the SOI layer or the support substrate with the buried insulator layer.

In this manner, the SOI wafer 50 having the polycrystalline silicon layer 52 is obtained and, as described above, there is a difference in the place where the polycrystalline silicon layer is formed between the case of ion-implanting into the bond wafer 14 with argon and the case of ion-implanting into the base wafer 11 in Step (c) of FIG. 1 mentioned above. In the case of ion-implanting into the bond wafer 11, as shown in FIG. 2 (a), the polycrystalline silicon layer 52 is formed in an interface area of the SOI layer 51 with the buried insulator layer 53. On the contrary, in the case of ion-implanting into the base wafer 14, as shown in FIG. 2 (b), the polycrystalline silicon layer 52 is formed in an interface area of the support substrate 54 with the buried insulator layer 53. Because there is no structural difference between the two in that the polycrystalline silicon layer exists in an interface area of the silicon single crystal layer with the insulator film, the polycrystalline silicon layers for both theoretically have nearly equal gettering ability.

However, due to the difference between the diffusion rates of metal impurities in silicon and those in silicon oxide, metal impurities have difficulty in passing the Box layer. Therefore it is pointed out that a gettering layer is preferably formed in the interface area of the SOI layer with the Box layer for the gettering of the metal contaminations on the surface of the SOI layer to be used as an area for fabricating a device. Namely, bonding is far preferably performed after forming the polycrystalline silicon layer by ion-implanting the surface of the bond wafer with argon.

However, even in a case where the surface of the base wafer is ion-implanted with argon and the polycrystalline silicon layer is formed in an interface area of the support substrate with the Box layer, an effective gettering site is obtained compared to a conventional method in which a gettering layer is introduced on a back surface of the SOI wafer. In addition, an SOI wafer having a thinner Box layer is developed every year. When the thickness of the Box layer is 100 nm or less, for example, even a gettering site by a polycrystalline silicon layer formed in the interface area of the support substrate with the Box layer is also more effective for the gettering of metal contaminations in the SOI layer.

Furthermore, in such a case where the bond wafer is extremely thinned to a thickness of, for example, 0.5 μm or less, in order to secure an area large enough to fabricate a device, a polycrystalline silicon layer is preferably formed not on the bond wafer but on the base wafer in some cases.

In a method for producing an SOI wafer of another embodiment of the present invention, an $n^+$ layer may further be introduced in the neighborhood of a layer where an ion-implanted damaged layer of the present invention is formed. The $n^+$ layer, sometimes required from an aspect of device structure, also possesses gettering ability and provides a stronger gettering site combined with gettering ability by a polycrystalline silicon layer formed according to the present invention.

Specifically, the $n^+$ layer is introduced by adopting a step of forming an $n^+$ layer through ion-implanting an element to serve as a donor in silicon, namely, phosphorus, arsenic, antimony, or the like from the same surface from which argon is ion-implanted at least before the bonding step in Step (d) of FIG. 1 mentioned above.

Furthermore, even in the case of introducing an $n^+$ layer apart from an ion-implanted damaged layer before the bonding step as described above, by performing ion-implanting of argon and a bonding heat treatment according to the conditions of the present invention, a polycrystalline silicon layer is formed without any trouble.

EXAMPLES

Hereinafter, the present invention is described more specifically showing examples of the present invention, but these examples should by no means be construed as limiting the present invention.

Examples 1 and 2

According to the steps as shown in FIG. 1, there were produced SOI wafers in which a polycrystalline silicon layer had been introduced as described in the following.

First there were prepared two mirror-polished N-type silicon single crystal wafers 725 μm in thickness, 200 mm in diameter, a plane orientation of {100} (a). On a surface of the base wafer 14, there was formed a silicon oxide film 13 approximately 1 μm in thickness to serve as a Box layer by thermal oxidation (b).

Then, onto the surface of the bond wafer 11, argon was ion-implanted at an acceleration voltage of keV and at a dosage of $1\times10^{15}$ atoms/cm² (Example 1) or $4\times10^{16}$ atoms/cm² (Example 2).

Next, the bond wafer 11 and the base wafer 14 were, with a surface of the bond wafer 11 ion-implanted with argon as a bonding surface, brought into contact and bonded together in such a way that a silicon oxide film 13 was put in between (d). Subsequently, a bonding heat treatment for increasing the bond strength was performed under the following conditions (e). First, the bonded wafer was placed into a heat treatment furnace set at 800° C. and the temperature was increased to the maximum temperature of 1150° C. at an increase rate of temperature of 10° C./min, kept for 2 h, and dropped to 800° C. Then the wafer was carried out of the heat treatment furnace.

Then, a side of the bond wafer 11 of the bonded wafer 20 was thinned by surface grinding and mirror polishing to a thickness of approximately 12 μm to obtain an SOI wafer 50 (f).

After the SOI wafers thus produced were cut in the thickness direction and the cut surface was polished, sectional TEM was observed.

Incidentally, the gettering ability of the SOI wafers thus produced was evaluated as follows. First, Ni was coated on the SOI layer surface at a density of approximately $1\times10^{13}$ atoms/cm² and was caused to diffuse internally by a heat treatment at 1000° C. for 1 hour under a nitrogen atmosphere. Next, by etching stepwise the surface oxide film, the SOI layer, the Box layer, and the support substrate surface layer (to approximately 2 μm from a surface at a side of the Box layer), a Ni concentration of the solution was recorded using ICP-MS (Inductively Coupled Plasma Mass Spectrometry) to determine the distribution of the Ni density in the depth direction. For each of the surface oxide film and the Box layer with a HF solution in one step, for the SOI layer with a mixed acid solution at intervals of approximately 2 μm in six separate steps, for the support substrate surface layer with a mixed acid solution in one step, Ni density was measured.

The determination results of gettering abilities are shown in FIG. 6 ((a) Example 1, (b) Example 2). Note that, under the horizontal axis, "SiO2" stands for the surface oxide film, "SOI-1-6" for the SOI layer separately measured in the order of distance from the surface, "Box" for the Box layer, "Base" for the support substrate surface layer, and "SUM" for the sum total.

Furthermore, sectional TEM images are shown in FIG. 10 ((a) Example 1, (b) Example 2).

Sectional TEM images in FIG. 10 show that a polycrystalline silicon layer was beginning to be formed in an interface area of the SOI layer with the Box layer under the conditions of Example 1 and that a polycrystalline silicon layer was more definitely formed under the conditions of Example 2.

In addition, it was found that, when a layer in the SOI layer 0 to 2 μm distant from the Box layer is a gettering layer, Ni was trapped in this gettering layer. It was also revealed that the SOI wafers of Examples 1 and 2 had high gettering abilities.

Example 3

An SOI wafer having a structure as shown in FIG. 2 (b) was produced in a method similar to the one used in Example 1 except that the base wafer 14 is ion-implanted with argon at a dosage of $4\times10^{16}$ atoms/cm² and that an oxide film approximately 50 nm in thickness was formed on the bond wafer 11. Then according to the technique similar to the one in Example 1, gettering ability was evaluated and the result is shown in FIG. 7.

As a result, it was found that Ni was trapped in the 2 μm-thick surface of the base wafer and that the SOI wafers of Example 3, with this surface as a gettering layer, had high gettering ability.

Comparative Example 1

An SOI wafer was produced in a method similar to the one used in Example 1 by ion-implanting the bond wafer with argon at a dosage of $1\times10^{14}$ atoms/cm². Then according to the technique similar to the one in Example 1, sectional TEM of SOI wafer was observed and the gettering ability was evaluated. The results of gettering ability are shown in FIG. 8 and sectional TEM images are shown in FIG. 11.

Formation of a polycrystalline silicon layer was not confirmed from a sectional TEM image in FIG. 11.

Furthermore, FIG. 8 reveals that although the SOI wafers of Comparative Example 1 had gettering ability in an interface area of the SOI layer with the Box layer, Ni remained in the neighborhood of the SOI layer surface. It was also revealed that the gettering ability of the SOI wafer of Comparative Example 1 was lower than those of the SOI wafers of Examples 1 and 2.

Comparative Example 2

After a polycrystalline silicon film approximately 4 μm in thickness was formed on a surface of the bond wafer by a CVD method, the polycrystalline silicon film was polished to a thickness of 1 μm. The polycrystalline silicon film was caused to face a silicon oxide film formed on a surface of the base wafer to be bonded and an SOI wafer was produced in a method similar to the one used in Example 1. However, thinning was performed until the thickness of the bond wafer was reduced to approximately 10 μm.

After that, the evaluation of the gettering ability was carried out in a method similar to the one used in Example 1 except that the determination of the SOI layer was performed at intervals of 2.5 μm in four separate steps and the result is shown in FIG. 9.

As a result, an SOI wafer having gettering ability was obtained. However, the process was complicated due to the required polishing of a polycrystalline silicon film and the like and productivity was low.

Examples 4 to 7 and Comparative Examples 3 to 7

According to the steps as shown in FIG. 1, there was additionally produced an SOI wafer in which a polycrystalline silicon layer had been introduced as described in the following.

First, there were prepared two mirror-polished N-type silicon single crystal wafers 725 μm in thickness, 200 mm in diameter, a plane orientation of {100} (a). On a surface of base wafer 14, there was formed a silicon oxide film 13 approximately 1 μm in thickness to serve as a Box layer by thermal oxidation (b).

Then, onto the surface of the bond wafer 11, argon was ion-implanted at an acceleration voltage of 60 keV and at a dosage of $1\times10^{14}$ atoms/cm$^2$ (Comparative Example 3), $5\times10^{14}$ atoms/cm$^2$ (Comparative Examples 4 and 5), $1\times10^{15}$ atoms/cm$^2$ (Examples 4 and 6 and Comparative Example 6), $1\times10^{16}$ atoms/cm$^2$ (Examples 5 and 7 and Comparative Example 7) (c).

Then, the bond wafer 11 and the base wafer 14 were brought into contact and bonded together, with the surface of the bond wafer 11 ion-implanted with argon as a bonding surface, in such a method that a silicon oxide film 13 was put in between (d).

Subsequently, a bonding heat treatment for increasing the bond strength was performed under the following conditions (e). First, the bonded wafer was placed into a heat treatment furnace set at 800° C. and the temperature was increased to the maximum temperature of 1150° C. at an increase rate of temperature of 10° C./minute (Comparative Examples 3 and 4 and Examples 4 and 5), 5° C./minute (Comparative Example 5 and Examples 6 and 7), or 1° C./minute (Comparative Examples and 7), kept for 2 h, and dropped to 800° C. Then the wafer was carried out of the heat treatment furnace.

Next, a side of the bond wafer 11 of the bonded wafer 20 was thinned by surface grinding and mirror polishing to a thickness of approximately 12 μm to obtain an SOI wafer 50 (f).

After an SOI wafer thus produced under each condition of argon dosage and temperature increase was cut in the thickness direction and the cut surface was polished, sectional TEM was observed.

Sectional TEM images are shown in FIG. 12 (*a*) to FIG. 12 (*i*).

Sectional TEM images in FIG. 12 show that a polycrystalline silicon layer was beginning to be formed in an interface area of the SOI layer with the Box layer under the conditions of (f: Example 6) and (g: Example 7) and that a polycrystalline silicon layer was more definitely formed under the conditions of (c: Example 4) and (d: Example 5).

It is to be noted that the present invention is not restricted to the foregoing embodiment. The foregoing embodiment is just an example, and any example which has a structure substantially equal to a technical-concept described in claims of the present invention and demonstrates the same functions and effects is included in a technical scope of the present invention.

The invention claimed is:

1. A method for producing a SOI wafer, comprising at least the steps of:
   preparing a base wafer and a bond wafer each made of silicon single crystal;
   forming an insulator film on a surface of at least one of the base wafer and the bond wafer;
   bonding the base wafer and the bond wafer via the insulator film to form a bonded wafer;
   a bonding heat treatment for increasing bonding strength by heat-treating the bonded wafer at a treatment temperature; and
   thinning the bond wafer, wherein
   argon is ion-implanted into a first surface, wherein the first surface is on either the base wafer or the bond wafer at a dosage of $1\times10^{15}$ atoms/cm$^2$ or more to form a layer that is ion-implanted with the argon, before the bonding step,
   the first surface ion-implanted with argon is used as a bonding surface in the bonding step,
   a rate of increase in temperature to the treatment temperature of the bonding heat treatment is 5° C./minute or higher, and
   the layer that is ion-implanted with the argon grows to be a polycrystal and forms a polycrystalline silicon layer in the SOI wafer.

2. The method for producing a SOI wafer according to claim 1, wherein the bonding heat treatment comprises maintaining the treatment temperature of 1100° C. or more for two hours or more.

3. The method for producing a SOI wafer according to claim 2, wherein after the thinning a thickness of the bond wafer is 1 μm or more and 50 μm or less.

4. The method for producing a SOI wafer according to claim 3, wherein the insulator film is a silicon oxide film, a silicon nitride film, or a combination of these.

5. The method for producing a SOI wafer according to claim 3, wherein the thinning of the bond wafer is carried out by grinding the bond wafer.

6. The method for producing a SOI wafer according to claim 3, wherein the thinning of the bond wafer is carried out by ion-implanting hydrogen or helium into a surface of the bond wafer to form an ion-implanted layer before the bonding step; and delaminating the bond wafer at the ion-implanted layer during a delaminating heat treatment during the thinning of the bond wafer.

7. The method for producing a SOI wafer according to claim 2, wherein the insulator film is a silicon oxide film, a silicon nitride film, or a combination of these.

8. The method for producing a SOI wafer according to claim 2, wherein the thinning of the bond wafer is carried out by grinding the bond wafer.

9. The method for producing a SOI wafer according to claim 2, wherein the thinning of the bond wafer is carried out by ion-implanting hydrogen or helium into a surface of the bond wafer to form an ion-implanted layer before the bonding step; and delaminating the bond wafer at the ion-implanted layer during a delaminating heat treatment during the thinning of the bond wafer.

10. The method for producing a SOI wafer according to claim 2, wherein an n+ layer is formed, before the bonding step, by ion-implanting an element to serve as a donor into the first surface before the argon is ion-implanted.

11. The method for producing a SOI wafer according to claim 10, wherein the element to serve as the donor is at least one of phosphorus, arsenic, and antimony.

12. The method for producing a SOI wafer according to claim 1, wherein after the thinning a thickness of the bond wafer is 1 μm or more and 50 μm or less.

13. The method for producing a SOI wafer according to claim 12, wherein the insulator film is a silicon oxide film, a silicon nitride film, or a combination of these.

14. The method for producing a SOI wafer according to claim 12, wherein the thinning of the bond wafer is carried out by grinding the bond wafer.

15. The method for producing a SOI wafer according to claim 12, wherein the thinning of the bond wafer is carried out by ion-implanting hydrogen or helium into a surface of the bond wafer to form an ion-implanted layer before the bonding step; and delaminating the bond wafer at the ion-implanted layer during a delaminating heat treatment during the thinning of the bond wafer.

16. The method for producing a SOI wafer according to claim 1, wherein the insulator film is a silicon oxide film, a silicon nitride film, or a combination of these.

17. The method for producing a SOI wafer according to claim 1, wherein the thinning of the bond wafer is carried out by grinding the bond wafer.

18. The method for producing a SOI wafer according to claim 1, wherein the thinning of the bond wafer is carried out by ion-implanting hydrogen or helium into a surface of the bond wafer to form an ion-implanted layer before the bonding step; and delaminating the bond wafer at the ion-implanted layer during a delaminating heat treatment during the thinning of the bond wafer.

19. The method for producing a SOI wafer according to claim 1, wherein an n+ layer is formed, before the bonding step, by ion-implanting an element to serve as a donor into the first surface before the argon is ion-implanted.

20. The method for producing a SOI wafer according to claim 19, wherein the element to serve as the donor is at least one of phosphorus, arsenic, and antimony.

21. The method for producing a SOI wafer according to claim 1, wherein the rate of increase in temperature to the treatment temperature of the bonding heat treatment is 10° C./minute or higher.

* * * * *